United States Patent
Fuergut et al.

(10) Patent No.: US 12,094,793 B2
(45) Date of Patent: Sep. 17, 2024

(54) PACKAGE WITH ELECTRICALLY INSULATED CARRIER AND AT LEAST ONE STEP ON ENCAPSULANT

(71) Applicant: Infineon Technologies AG, Neubiberg (DE)

(72) Inventors: Edward Fuergut, Dasing (DE); Chii Shang Hong, Melaka (MY); Teck Sim Lee, Melaka (MY); Bernd Schmoelzer, Radenthein (AT); Ke Yan Tean, Melaka (MY); Lee Shuang Wang, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/380,276

(22) Filed: Oct. 16, 2023

(65) Prior Publication Data

US 2024/0038612 A1    Feb. 1, 2024

Related U.S. Application Data

(63) Continuation of application No. 17/502,082, filed on Oct. 15, 2021, now Pat. No. 11,876,028.

(30) Foreign Application Priority Data

Nov. 19, 2020    (DE) ...................... 10 2020 130 612.1

(51) Int. Cl.
*H01L 23/31*    (2006.01)
*H01L 21/56*    (2006.01)
(Continued)

(52) U.S. Cl.
CPC .......... *H01L 23/3121* (2013.01); *H01L 21/56* (2013.01); *H01L 23/3107* (2013.01);
(Continued)

(58) Field of Classification Search
CPC ... H01L 2924/181; H01L 21/56; H01L 24/49; H01L 24/83; H01L 24/46; H01L 23/3121;
(Continued)

(56) References Cited

U.S. PATENT DOCUMENTS 5,394,298 A * 2/1995 Sagisaka ........... H01L 23/49827
257/796
5,834,842 A    11/1998 Majumdar et al.
(Continued)

FOREIGN PATENT DOCUMENTS

DE    10 2020 129 423    5/2022
EP    0 484 180    5/1992
(Continued)

OTHER PUBLICATIONS

Non-Final Office Action dated Jun. 8, 2023 in U.S. Appl. No. 17/502,082.
(Continued)

*Primary Examiner* — Alonzo Chambliss
(74) *Attorney, Agent, or Firm* — Dicke, Billig & Czaja, PLLC

(57) ABSTRACT

A package is disclosed. In one example, the package includes a first main face for mounting a heat sink and an opposing second main face for being mounted on a mounting base. The package comprises a carrier, an electronic component mounted at the carrier, and an encapsulant encapsulating at least part of the electronic component and at least part of the carrier. Electrically insulating material covers electrically conductive material of the carrier at said first main face. The encapsulant comprises at least one step at the first main face.

20 Claims, 7 Drawing Sheets

(51) Int. Cl.
*H01L 23/00* (2006.01)
*H01L 23/495* (2006.01)
*H01L 23/498* (2006.01)

(52) U.S. Cl.
CPC .. *H01L 23/49506* (2013.01); *H01L 23/49537* (2013.01); *H01L 23/49541* (2013.01); *H01L 23/49551* (2013.01); *H01L 23/49555* (2013.01); *H01L 23/49568* (2013.01); *H01L 23/49838* (2013.01); *H01L 24/46* (2013.01); *H01L 24/49* (2013.01); *H01L 24/83* (2013.01); *H01L 23/49503* (2013.01); *H01L 23/49575* (2013.01); *H01L 2924/181* (2013.01)

(58) Field of Classification Search
CPC ......... H01L 23/49503; H01L 23/49537; H01L 23/49555; H01L 23/49568; H01L 23/49575; H01L 23/49506; H01L 23/49541; H01L 23/49838; H01L 23/3107; H01L 23/49551
See application file for complete search history.

(56) References Cited

U.S. PATENT DOCUMENTS

| | | | |
|---|---|---|---|
| 7,847,395 B2 | 12/2010 | Baek | |
| 9,331,001 B2 | 5/2016 | Kadoguchi et al. | |
| 10,566,260 B2 | 2/2020 | Otremba | |
| 11,621,204 B2 | 4/2023 | Kreiter | |
| 11,876,028 B2* | 1/2024 | Fuergut | H01L 24/40 |
| 2002/0111008 A1* | 8/2002 | Ho | H01L 23/4951 |
| | | | 257/E23.092 |
| 2005/0121777 A1 | 6/2005 | Hata et al. | |
| 2007/0205503 A1* | 9/2007 | Baek | H01L 23/3675 |
| | | | 257/712 |
| 2010/0025828 A1 | 2/2010 | Sakai | |
| 2010/0059870 A1* | 3/2010 | Wen | H01L 25/0655 |
| | | | 257/E23.051 |
| 2010/0148328 A1 | 6/2010 | Son et al. | |
| 2012/0273265 A1 | 11/2012 | Tien | |
| 2014/0103505 A1* | 4/2014 | Zhao | H01L 23/4334 |
| | | | 257/E21.599 |
| 2015/0173246 A1 | 6/2015 | Jang et al. | |
| 2018/0061745 A1 | 3/2018 | Otremba | |
| 2018/0160569 A1 | 6/2018 | Yoshihara | |
| 2019/0067154 A1 | 2/2019 | Yoshihara et al. | |
| 2019/0080973 A1 | 3/2019 | Otremba et al. | |
| 2019/0335628 A1 | 10/2019 | Lei et al. | |
| 2019/0355643 A1* | 11/2019 | Hong | H01L 23/49805 |
| 2020/0258824 A1 | 8/2020 | Maldo et al. | |
| 2022/0148934 A1 | 5/2022 | Fuergut et al. | |
| 2022/0157682 A1 | 5/2022 | Fuergut | |

FOREIGN PATENT DOCUMENTS

EP 1162659 A2 * 12/2001 ............. F28D 15/02
EP 2 613 351 7/2013

OTHER PUBLICATIONS

Notice of Allowance dated Jul. 27, 2023 in U.S. Appl. No. 17/502,082.

* cited by examiner

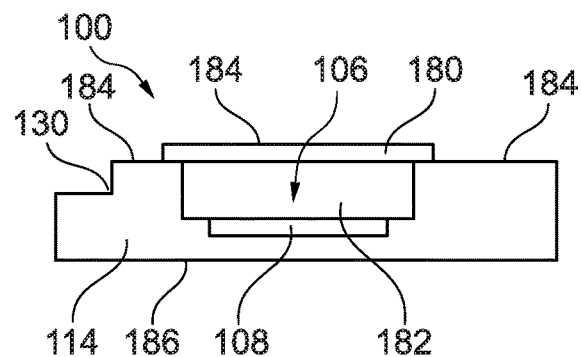
Fig. 1
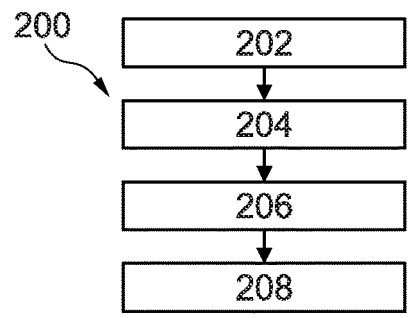
Fig. 2
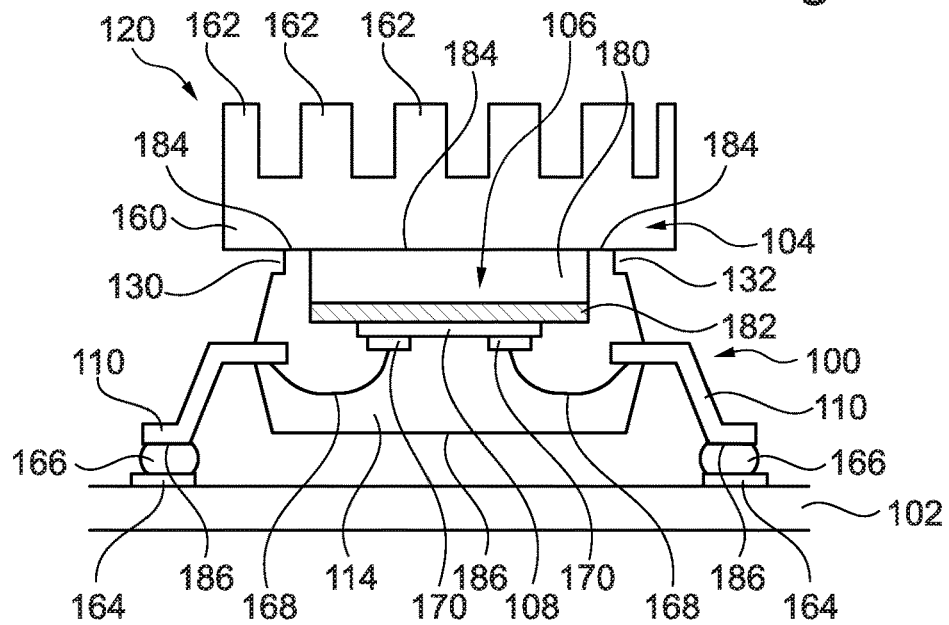
Fig. 3
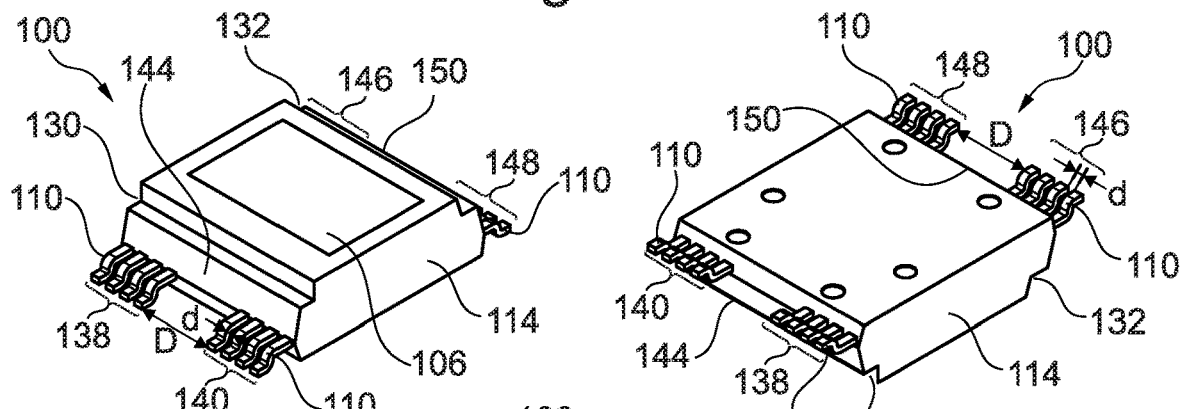
Fig. 4
Fig. 5
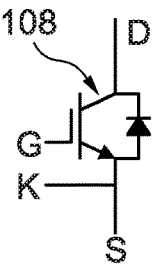
Fig. 6

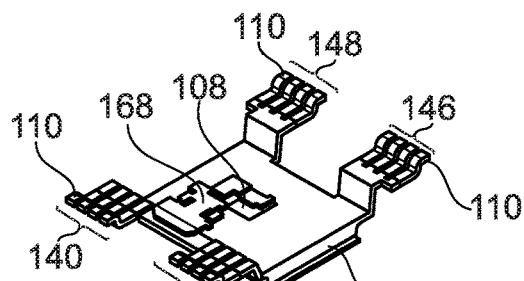
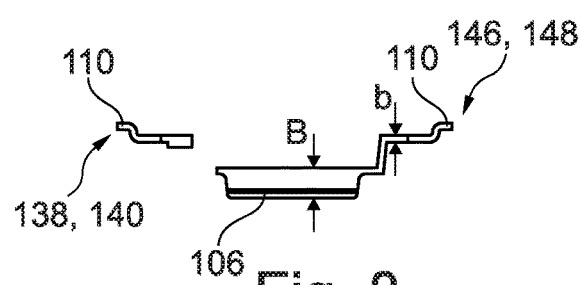
Fig. 7  Fig. 8
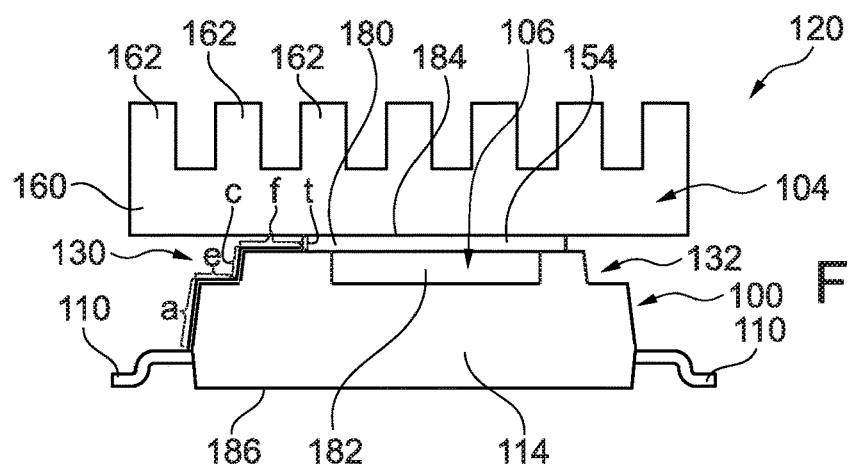
Fig. 9
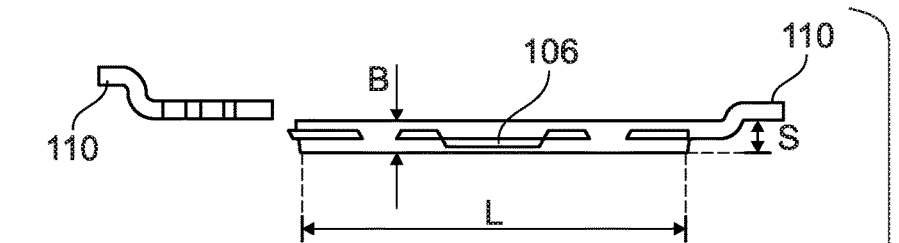
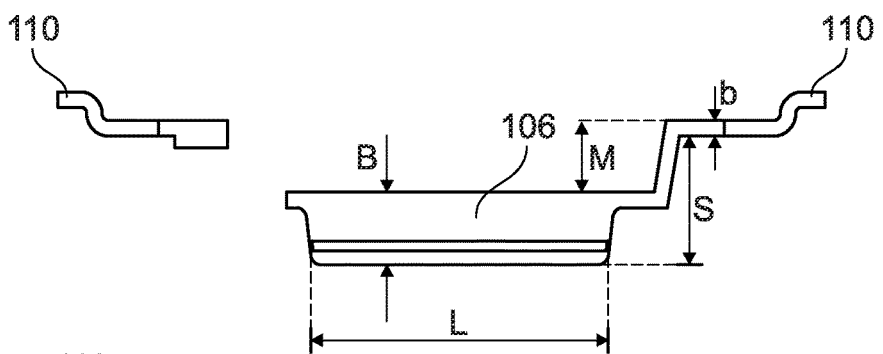
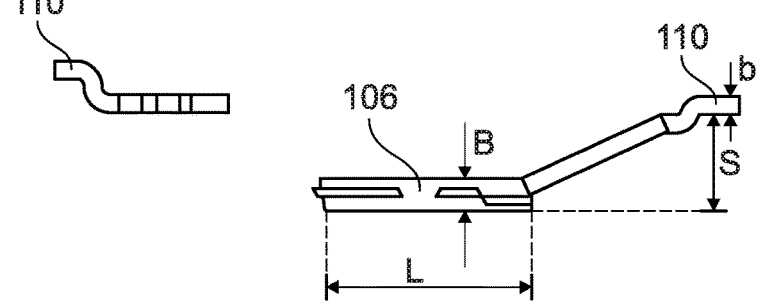
Fig. 10

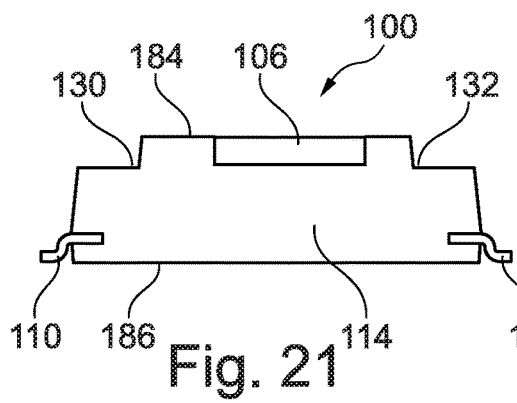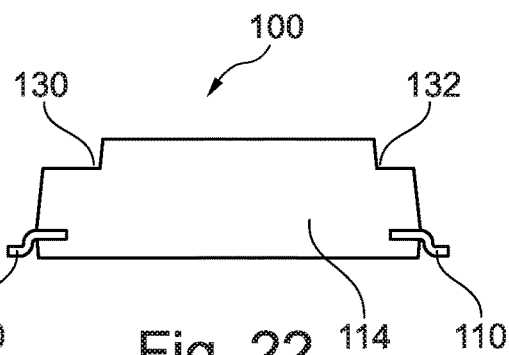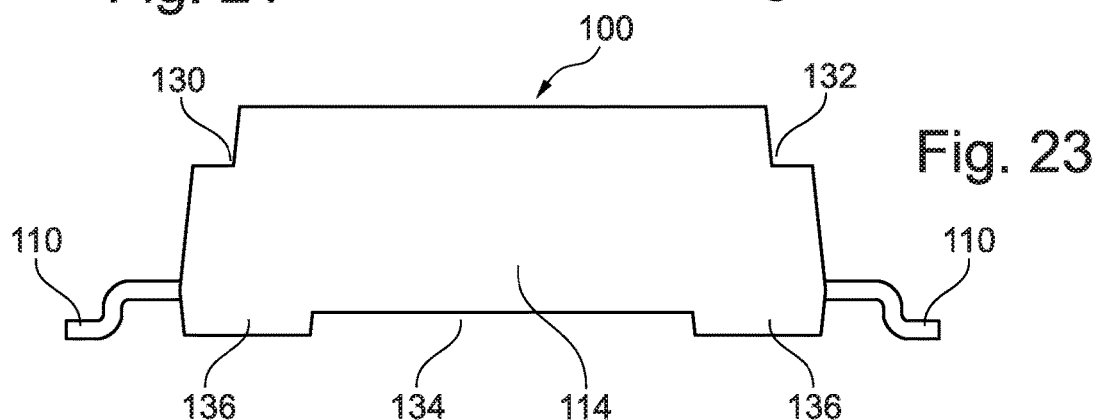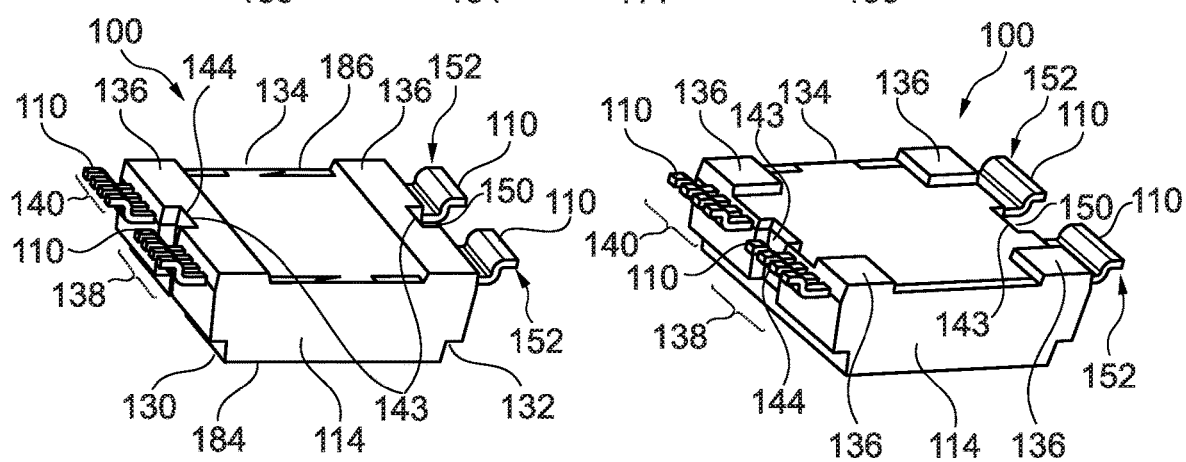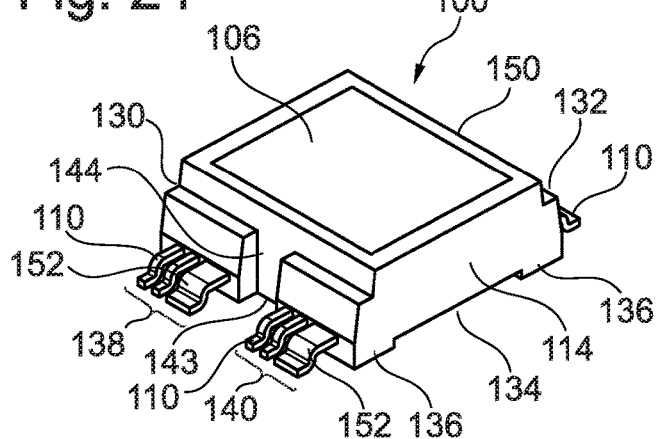

PACKAGE WITH ELECTRICALLY INSULATED CARRIER AND AT LEAST ONE STEP ON ENCAPSULANT

CROSS-REFERENCE TO RELATED APPLICATION

The present application is a continuation application of U.S. patent application Ser. No. 17/502,082, filed Oct. 15, 2021, and claims priority to German Patent Application No. 10 2020 130 612.1, filed Nov. 19, 2020, which is incorporated herein by reference.

BACKGROUND

Technical Field

Various embodiments relate generally to a package, an electronic device, and a method of manufacturing a package.

Description of the Related Art

Packages may be denoted as usually encapsulated electronic components with electrical connects extending out of the encapsulant. For example, packages may be connected to an electronic periphery, for instance mounted on a printed circuit board and/or connected with a heat sink, and may be connected via connectors to a larger system.

Power density is an important driver for the industry. Related with this are performance, dimensions and reliability. The different packaging solutions are manifold and have to address the needs of a specific application.

In particular packages with power semiconductor chips may generate a considerable amount of heat during operation. This may limit reliability and performance. Efficiently removing heat from the package may be accomplished by a heat sink or the like. At the same time, electric reliability of a package is required.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 illustrates a schematic cross-sectional view of a package according to an exemplary embodiment.

FIG. 2 illustrates a flowchart of a method of manufacturing a package according to an exemplary embodiment.

FIG. 3 illustrates a cross-sectional view of an electronic device comprising a package according to an exemplary embodiment and being mounted between a mounting base and a heat sink.

FIG. 4 illustrates a three-dimensional top view of a package according to an exemplary embodiment.

FIG. 5 illustrates a three-dimensional bottom view of the package according to FIG. 4.

FIG. 6 illustrates a circuit diagram of the package according to FIG. 4 and FIG. 5.

FIG. 7 illustrates a three-dimensional bottom view of the package according to FIG. 4 to FIG. 6 without encapsulant.

FIG. 8 illustrates a side view of the package according to FIG. 4 to FIG. 7 without encapsulant and without electronic component.

FIG. 9 illustrates a cross-sectional view of an electronic device comprising a package according to an exemplary embodiment with a heat sink mounted thereon.

FIG. 10 illustrates a side view of carriers and leads of packages according to exemplary embodiments.

FIG. 21 illustrates a cross-sectional view of a package with an encapsulant having symmetrical steps according to an exemplary embodiment.

FIG. 22 illustrates a side view of a package with an encapsulant having asymmetrical steps according to an exemplary embodiment.

FIG. 23 illustrates a cross-sectional view of a package with an encapsulant having a bottom-sided recess according to another exemplary embodiment.

FIG. 24 illustrates a three-dimensional bottom view of the package according to FIG. 23.

FIG. 25 illustrates a three-dimensional bottom view of a package with an encapsulant having a bottom-sided recess according to another exemplary embodiment.

FIG. 26 illustrates a three-dimensional view of a package with an encapsulant having a side wall with indentation according to an exemplary embodiment.

DETAILED DESCRIPTION

Figure 11:
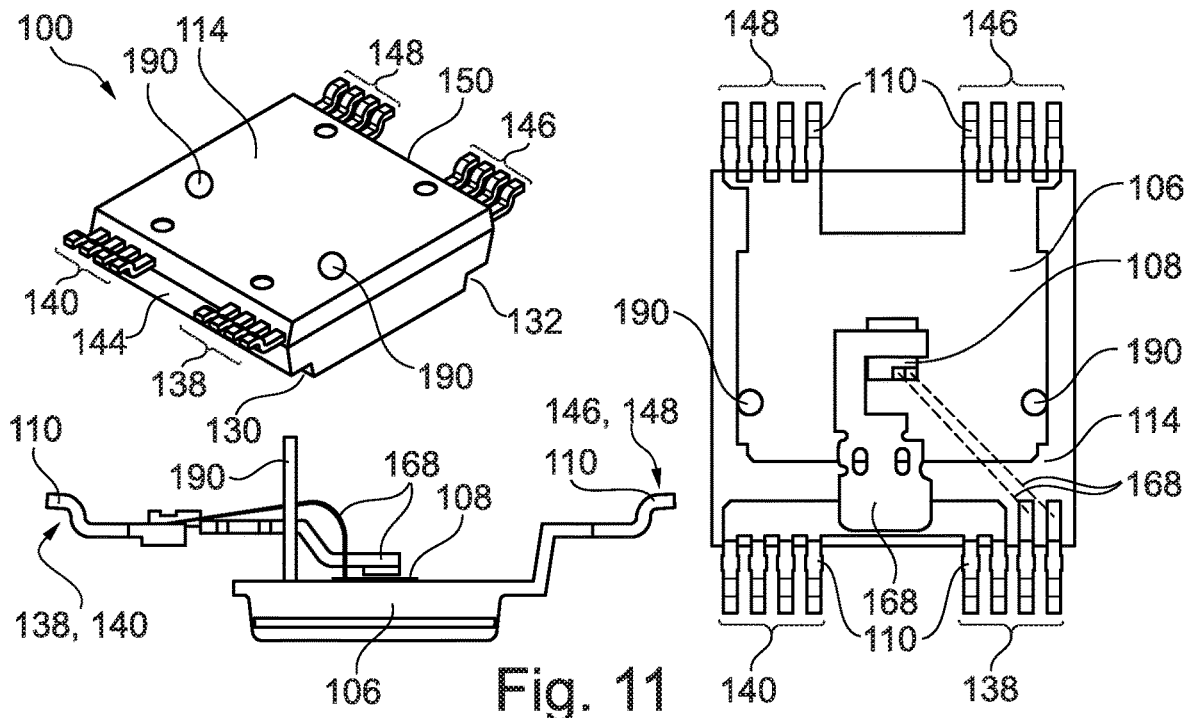
FIG. 11 illustrates a three-dimensional bottom view, a side view without encapsulant, and a transparent bottom view of a package according to an exemplary embodiment.

There is a need for a package with proper electric reliability and efficient heat removal.

According to an exemplary embodiment, a package having a first main face (such as a first main surface) for mounting a heat sink and an opposing second main face (such as a second main surface) for being mounted on a mounting base is provided, wherein the package comprises a carrier, an electronic component mounted at the carrier, and an encapsulant encapsulating at least part of the electronic component and at least part of the carrier, wherein electrically insulating material covers electrically conductive material of the carrier at said first main face, and wherein the encapsulant comprises at least one step at said first main face.

According to another exemplary embodiment, an electronic device is provided, wherein the electronic device comprises a package having the above mentioned features, and a heat sink mounted on the first main face of the package.

According to yet another exemplary embodiment, a method of manufacturing a package having a first main face for mounting a heat sink and an opposing second main face for being mounted on a mounting base is provided, wherein the method comprises mounting an electronic component at a carrier, encapsulating at least part of the electronic component and at least part of the carrier by an encapsulant, covering electrically conductive material of the carrier with electrically insulating material at said first main face, and forming at least one step at the encapsulant at said first main face.

According to an exemplary embodiment, a package is provided in which a carrier carrying an electronic component and being encapsulated partially or entirely within an encapsulant is covered with electrically insulating material also a first main face which may face a heat sink for removing heat created by the electronic component during operation of the package. The encapsulation and the coverage with electrically insulating material may contribute to an excellent electric reliability of the package. Highly advantageously, the formation of one or more steps at an exterior side of the encapsulant at the first main face at which the package may be thermally coupled with a heat sink may result in an increased creepage distance (i.e. an increased length of a shortest path between two conductive materials measured along the surface of an isolator that separates the conductors). Descriptively speaking, the formation of one or more steps creates a mechanical obstacle for electric current which may flow unintentionally along an exterior surface of the package for creating highly undesired short-circuiting of electrically conductive elements of the electronic device. The combination of the one or more steps and the coverage of the at least partially encapsulated carrier by the electrically insulating material on the heat removal side of the package may allow to strongly suppress undesired creepage current. This may increase the electric reliability of the package while simultaneously ensuring a proper performance of the package.

In the following, further exemplary embodiments of the package, the electronic device, and the method will be explained.

In the context of the present application, the term "package" may particularly denote an electronic member which may comprise one or more electronic components mounted on one or more carriers, said at least one carrier to comprise or consist out of a single part, multiple parts joined via encapsulation or other package components, or a subassembly of carriers. Said constituents of the package may be optionally encapsulated at least partially by an encapsulant.

In the context of the present application, the term "mounting base" may in particular denote a support body on which the package may be assembled, for instance together with one or more further packages. In particular, such a support body may be mechanically and electrically coupled with the package(s). In particular, the mounting base may be a plate-shaped electronic mounting base, such as a printed circuit board (PCB).

In the context of the present application, the term "heat sink" may in particular denote a highly thermally conductive body which may be thermally coupled with the package and in particular the carrier of the package for removing heat generated by the electronic component during operation of the package. For example, the heat sink may be made of a material having a thermal conductivity of at least 10 W/mK, in particular at least 50 W/mK. For instance, the heat sink may be made of an electrically conductive material such as copper and/or aluminum, but may also comprise a ceramic material. The heat sink may be directly or indirectly thermally coupled with the carrier, for instance by a thermally conductive and electrically insulating carrier portion, a thermal interface material and/or a gap filler. For example, the heat sink may comprise a thermally conductive body (such as a metal plate) with a plurality of cooling fins extending from the thermally conductive body. Additionally or alternatively, liquid and/or gas cooling may be accomplished by a heat sink as well. The thermal coupling of the package with a heat sink may ensure for an efficient cooling. Optionally, a gap filler may surround the heat sink (and/or an encapsulant).

In the context of the present application, the term "carrier" may particularly denote a support structure which serves as a mechanical support for one or more electronic components to be mounted thereon. In other words, the carrier may fulfil a mechanical support function. Additionally or alternatively, a carrier may also fulfill an electrical connection function. A carrier may comprise or consist of a single part, multiple parts joined via encapsulation or other package components, or a subassembly of carrier sections. A carrier may also contribute to heat spreading in the package for promoting thermal dissipation. A sufficiently high heat capacity of a carrier may be advantageous for a short overload. For example, a carrier may form part of a leadframe.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated. Semiconductor chips implemented according to exemplary embodiments may be formed in particular in silicon technology, gallium nitride technology, silicon carbide technology, etc.

In the context of the present application, the term "encapsulant" may particularly denote an electrically insulating and preferably thermally conductive material surrounding at least part of an electronic component and at least part of a carrier, as well as a part of one or more leads. For instance, the encapsulant may be a mold compound and may be manufactured for example by transfer molding.

In the context of the present application, the term "step" may in particular denote an abrupt (for instance edged or rounded) change in the exterior surface of the encapsulant. In particular, a step may be formed as a sequence of an exterior protrusion next to an exterior indentation. A step may constitute an interface between different surface portions of the encapsulant having different slope values. For instance, a step may be defined by a first surface portion of the encapsulant having a first slope value, followed by a second surface portion of the encapsulant having a second slope value, followed, in turn, by a third surface portion of the encapsulant having a third slope value, the second slope value being smaller than each of the first and the third slope values. An edge may be formed between the first surface portion and the second surface portion. A further edge may be formed between the second surface portion and the third surface portion. The at least one step may be visible at an exterior surface of the encapsulant in a side view or in a cross-sectional view of the package. In particular, the step may be formed in a linear way along one side of the encapsulant, or may extend circumferentially. In particular, each of the at least one step may be formed by a slanted or vertical surface portion connecting two vertically spaced slanted or horizontal surface portions of the encapsulant at the above-mentioned first main face or side of the package. In a slanted configuration, a slanting angle of the two latter vertically spaced surface portions may be smaller than a slanting angle of the former surface portion.

Generally, the electrically insulating material may form part of the encapsulant, may form part of the carrier, or may be formed of another material and/or as another structure than the encapsulant and the carrier. In particular, the following embodiments are possible:

In an embodiment, the electrically insulating material comprises or consists of material of the encapsulant. In such an embodiment, the carrier may be fully surrounded (in particular fully overmolded) by encapsulant material. This is particularly simple in terms of manufacturability.

In an embodiment, the electrically insulating material comprises or consists of an exterior portion of the carrier. For instance, the carrier may comprise an electrically conductive structure (such as a continuous or patterned metal layer), for instance facing the electronic component for contributing to the electric connection in an interior of the package. Moreover, the carrier may comprise an electrically insulating structure (for instance a ceramic plate), for example forming an exterior portion of the carrier or even of the entire package. Advantageously, such a ceramic plate may not only be electrically insulating but may also be thermally conductive so as to contribute to the removal of heat (which may be created by the electronic component) out of the package.

In an embodiment, the electrically insulating material is applied on a surface (in particular an electrically conductive surface) of the carrier being exposed with respect to the encapsulant. The mentioned electrically insulating material may be selected specifically to meet the requirements of electrically insulating the carrier and of removing heat out of the package. For instance, the electrically insulating material can be a thermal interface material (TIM).

In an embodiment, a sum of a height of the at least one step, and a height of the electrically insulating material is at least 0.25 mm, in particular at least 1 mm, more particularly at least 1.5 mm, and even more particularly at least 2.5 mm. Industrial standards (in particular IEC 60664-1:2007 in the version 2007-04, see in particular chapter 6.2) may define requirements for packages for specific classes in terms of pollution protection and environmental protection. When the mentioned sum of heights is at least 0.25 mm, the package may fulfil the requirements of pollution degree 1. When the mentioned sum of heights is at least 1 mm, the package may fulfil the requirements of pollution degree 2. When the mentioned sum of heights is at least 1.5 mm, the package may fulfil the requirements of pollution degree 3. When the mentioned sum of heights is at least or even more than 2.5 mm, the package may even fulfil the requirements of pollution degree 4. Hence, the one or more steps may be designed to achieve compliance of the package with even demanding environmental standards.

In an embodiment, each of the at least one step is formed by a slanted or vertical surface portion connecting two vertically spaced slanted or horizontal surface portions of the encapsulant at said first main face (wherein a slanting angle of the two latter vertically spaced surface portions may be smaller than a slanting angle of the former surface portion). Such a design may be manufactured in a simple way by a corresponding shaping of mold tools.

In an embodiment, the package comprises a plurality of steps at said first main face, wherein the carrier and/or the electrically insulating material is/are arranged laterally between different ones of the steps. By providing the encapsulant with a plurality of steps circumferentially surrounding the carrier and/or the dielectric spacer, the protection of the electronic component against undesired creepage current may be further improved.

In an embodiment, said different steps are arranged symmetrically with respect to the carrier and/or with respect to the electrically insulating material. In particular, a side view or cross-sectional view of the package may indicate trajectories of creepage current along opposing sides of the package with identical shape and length. A symmetric configuration may ensure a reliable protection against creepage current at both or all sides of the package equally.

In another embodiment, said different steps are arranged asymmetrically with respect to the carrier and/or with respect to the electrically insulating material. In particular, a side view or cross-sectional view of the package may indicate trajectories of creepage current along opposing sides of the package with different shape and/or length. Asymmetrically configuring the configuration may allow to consider different voltage requirements and/or different geometries at different connections and consequently different demands in terms of creepage current protection of the package.

In an embodiment, the encapsulant comprises a recess at the second main face or side of the package. In other words, a recess may be formed at a bottom second main face of the encapsulant. In particular, said recess may form at least one spacer at said second main face of the package. Thus, at least one foot, and in particular a plurality of feet may be created in this way. This may reliably protect the package from undesirable tilting at the bottom side.

In an embodiment, the package comprises leads which are electrically coupled with the electronic component and which are to be electrically coupled with the mounting base. In the context of the present application, the term "lead" may in particular denote an electrically conductive (for instance strip shaped) element (which may be planar or bent) which may serve for contacting the electronic component with an exterior of the package. For instance, a lead may be partially encapsulated and partially exposed with respect to an encapsulant. In particular, the leads may extend out of side walls of the encapsulant. By the provision of one or more steps as the upper side of the encapsulant, leakage currents from the electrically conductive leads to the at least partially electrically conductive carrier may be suppressed.

As already mentioned, a part of the leads may be encapsulated by the encapsulant and another part of the leads may be exposed with respect to the encapsulant. This may enable to electrically couple the electronic component via the leads with the mounting base. In order to simplify such an electric connection at the bottom side, the leads may be bent downwardly.

In an embodiment, the leads comprise a first group of leads and a second group of leads extending side by side (for example, parallel to each other in a plan view of the package), wherein each adjacent pair of the leads of the first group and each adjacent pair of the leads of the second group is spaced by a lateral lead-to-lead distance being smaller than a lateral group-to-group distance between the first group and the second group of leads. In particular, the first group of leads and the second group of leads may extend out of the same side wall of the encapsulant. Such a split leads configuration has the advantage that each group of leads may be assigned to a respective voltage domain. Within one group of leads, a relatively small voltage difference (for instance in the range from 1 V to 50 V, in particular from 10 V to 20 V) may be implemented, so that a compact arrangement of the leads of a group may be possible without involving significant electronic risks. In contrast to this, a strong electric isolation may be ensured between different groups of leads by the larger group-to-group distance. By taking this measure, a compact design may be combined with a high electric reliability. More specifically, split lead groups may be spaced for achieving compliance with even demanding specifications in terms of creepage distance and clearance distance (i.e. a vertical distance between different conductors of the package).

In an embodiment, the leads further comprise a third group of leads and a fourth group of leads extending side by side, wherein each adjacent pair of the leads of the third group and each adjacent pair of the leads of the fourth group is spaced by a lateral lead-to-lead distanced being smaller than a lateral group-to-group distance between the third group and the fourth group of leads, and wherein the third group of leads and the fourth group of leads extend out of another side wall of the encapsulant opposing the side wall out of which the first group of leads and the second group of leads extend. Thus, a split lead configuration may be established in particular on two opposing sides of the package. This renders the package appropriate even for complex electronic applications while achieving sufficiently large creepage and clearance distances.

In an embodiment, the package is designed so that a creepage distance between adjacent groups of leads differs by not more than 20% from a creepage distance between the package and the heat sink. As a result, a package with homogeneous creepage current suppression properties is provided being free of pronounced weak points in terms of creepage current flow.

In an embodiment, the leads are bent away downwardly from the carrier, and the carrier has a thickness being larger than a thickness of the leads. Descriptively speaking, a locally thickened die paddle carrying the electronic component may be arranged next to down set leads. A carrier (for instance a metal support) being thicker than leads may promote the heat removal capability of the package, since such a carrier may efficiently conduct heat away from the electronic component. At the same time, a down set of the leads may be limited in view of the thickness increase of the die paddle without suffering from a significant deterioration of creepage and clearance requirements. Generally, it may be desired, as such, to have a sufficiently large down set of the leads for increasing the clearance distance. However, a very large vertical distance between leads and carrier may result in a package with large space consumption in vertical direction. Advantageously, a moderate value of the down set has turned out to be sufficient when the thickness of the carrier is increased. For instance, a ratio between a thickness of the carrier and the down set may be at least 0.3, in particular at least 0.6.

In an embodiment, a side wall of the encapsulant comprises a protrusion and/or an indentation, in particular between different leads or between different groups of leads. Descriptively speaking, a protrusion or indentation at a side wall of the encapsulant between adjacent leads may extend the length along which a creepage current has to propagate to create an undesired short-circuiting between different leads. Hence, such a protrusion or indentation may further improve the electric reliability of the package.

In an embodiment, the package comprises one or more further carriers and one or more further electronic components mounted at the one or more further carriers. Thus, the package may comprise a plurality of carriers (for instance two, three, or even more than three) which may be encapsulated at least partially by the same encapsulant. It is also possible that the package comprises a plurality of electronic components (for instance two, three, or even more than three) which may be encapsulated at least partially in the same encapsulant. Hence, the described package concept is properly compatible with multi-component, module, and system-in-package architectures. Modern chip technology (for instance chips configured in silicon carbide technology) may allow the provision of small dies as electronic components. It may then be possible to split a carrier into two or more parts, i.e. to provide a split die pad. This allows the manufacture of system-in-package devices, for instance configured as alternating current (AC) switches, half bridges, etc.

In an embodiment, the encapsulant encapsulates at least part of the at least one further electronic component and at least part of the at least one further carrier, wherein the electrically insulating material covers electrically conductive material of the further carrier at said first main face of the package. In particular, a respective step may be formed for each carrier at a correspondingly adjacent side wall for ensuring a proper creepage distance for each of the encapsulated carriers and assigned electronic components.

In an embodiment, the carrier and the further carrier are identical structures (in particular leadframe structures) rotated by 180° relative to each other. In another embodiment, the carrier and the further carrier are identical structures (in particular leadframe structures) aligned in parallel to each other. Such architectures may be advantageously implemented in terms of a split lead configuration described above. In an embodiment, the electronic device comprises a mounting base on which the package is mounted. For example, such a mounting base may be a printed circuit board (PCB). The mounting base may function as a mechanical support for the package. It is also possible that the mounting base is electrically coupled with the package, for instance by establishing a solder connection between pads of the mounting base and free ends of leads of the package.

In an embodiment, the electrically insulating material is arranged at an interface between the heat sink and the package. In another words, the electrically insulating material may electrically decouple the carrier with respect to the heat sink. Preferably, the electrically insulating material has additionally thermally conductive properties (in particular a thermal conductivity of at least 2 W/mK) for efficiently contributing to a heat removal from the electronic component towards the heat sink.

In an embodiment, the electrically insulating material covering the electrically conductive material of the carrier and thereby spacing the electrically conductive material with respect to the heat sink may have a thickness in a range from 100 μm to 2 mm, in particular in a range from 100 μm to 1 mm, more particularly in a range from 100 μm to 600 μm. This may ensure a proper mutual isolation while nevertheless guaranteeing a proper thermal coupling with the heat sink.

In an embodiment, an outline of the package is free of a tie bar. In a preferred embodiment, the package is configured as tie bar-less package (i.e. a package being entirely free of any tie bar). Tie bars may be used for interconnecting constituents of different packages during manufacture. In many cases, tie bars are made of metal, and may for example form part of a leadframe. During separating individual packages manufactured in a batch procedure, said tie bars may be separated as well. However, cutting through metallic tie bar material may be cumbersome and may decelerate the separation process. Due to the manufacturing architecture of an exemplary embodiment, cutting through tie bars may be dispensable, since tie bars may be omitted in particular in regions in which packages are singularized. The described embodiments may ensure that no electrically conductive material is located on a side wall of the encapsulant apart from the leads. Consequently, the risk of creepage currents may be further suppressed.

In an embodiment, the carrier comprises a stack composed of an electrically insulating and thermally conductive layer (such as a ceramic layer) covered on one or both opposing main surfaces by a respective electrically conductive layer (such as a copper layer or an aluminium layer, wherein the respective electrically conductive layer may be a continuous or a patterned layer). In particular, the carrier may be a Direct Copper Bonding (DCB) substrate or a Direct Aluminium Bonding (DAB) substrate. However, the carrier may also be configured as Active Metal Brazing (AMB) substrate, as Insulated Metal Substrate (IMS) or as patterned metal plate (for example a leadframe).

In an embodiment, the at least one electronic component comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

In an embodiment, the package is configured as power converter, in particular one of an AC/DC power converter and a DC/DC power converter. However, also other electronic applications, such as inverters, etc., may be possible.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

According to exemplary embodiments, a package is provided which comprises dielectric material on a top side for reliably electrically decoupling a (for instance at least partially metallic) carrier with respect to a (in particular at least partially metallic) heat sink mounted on top of the package. Additionally, one or more steps may be formed at an exterior surface of the encapsulant at the side of the package to be connected to the heat sink. Such steps may be highly advantageous for high-voltage packages (for instance operating at an electric voltage of at least 700 V, in particular at least 1200 V, more particularly at least 2000 V) for ensuring a sufficiently large creepage distance along an exterior dielectric surface area of the package. Such packages may comprise an electronic component configured as semiconductor power chip, and may include for instance a transistor (such as a metal oxide semiconductor field effect transistor, MOSFET), or a diode. The provision of one or more steps at the upper exterior encapsulant surface renders a current path along an exterior surface of the encapsulant more complex and thereby suppresses creepage currents tending to short-circuit for instance leads and heat sink and/or carrier. Descriptively speaking, such steps may increase a creepage distance or may render a creepage current trajectory more complex. At the same time, such a package may also provide a sufficiently large clearance distance.

An exemplary embodiment provides a package which may be manufactured in surface mounted device (SMD) technology with top side cooling (TSC). More specifically, such an SMD TSC package may be provided with high voltage capability and may for instance be appropriate for 1200 V applications. For example, such a package may comprise an electronic component embodied in SiC MOS technology. Hence, an exemplary embodiment relates to a package configured for SMD top side cooling for applications with voltages of up to 1200 V or more.

An exemplary embodiment provides a package configured as surface-mounted device with top side cooling and adapted for a 1200 V voltage class. In particular, such a package may be provided with a split chip carrier or die pad. Such an SMD TSC package may be provided with a structural encapsulant (in particular mold body) with one or more steps increasing the robustness against creepage currents which may flow along a main surface of the package facing a heat sink. One embodiment of the package provides symmetrical steps, whereas another embodiment provides asymmetrical steps at the top side of the encapsulant. In an embodiment, symmetrical leads may extend out of opposing side walls of the encapsulant. In embodiments, such leads may be centralized around a die pad. Furthermore, an encapsulant may be embodied as a mold body with a structural feature at a bottom mold. In an embodiment, the encapsulant (in particular mold body) may be equipped with one or more intrusion(s) and/or protrusion(s) between (in particular split) leads for further improving the creepage current suppression properties of the package. Yet another embodiment provides a package with an array lead configuration within the same package outline (i.e. comprising a set of leads with different lead sizes). The carrier of the package may be fully isolated by encapsulant material alone, by a combination of encapsulant material and a dielectric part of the carrier itself, or by encapsulant material and a further electrically insulating structure (such as a thermal interface material, TIM). The package may be embodied as a tie bar-less package for avoiding any functionally indispensable electrically conductive material at an exterior side of the package apart from the leads. In one embodiment, the carrier may be configured as split die pad, each die pad carrying at least one electronic component. In a split die pad configuration, different die pads may have the same configuration and orientation, or may be oriented with a mutual 180° rotation.

Exemplary embodiments have the advantage that generally less leads may be sufficient for designing the package. This may reduce the heat dissipation into the application board. As a result, an improved system level reliability and/or less restrictions concerning the design of the mounting base (such as a PCB) may be obtained.

Packages according to exemplary embodiments may be configured to be mountable in through-hole technology (THT). Through-hole technology may denote a mounting scheme for electronic components that involves the use of leads on the electronic components that are inserted into holes drilled in printed circuit boards (PCB) and soldered to pads on the opposite side. Such THT-type packages (like DIPs) may be in particular appropriate for power modules, intelligent power modules or smart power modules.

Thermal interface material (TIM) may be advantageous to compensate a tolerance of an application heat sink and a package (in particular with an individual package and especially for multiple packages). In particular, height compensation up to 500 μm may occur depending on the amount of PCB warpage, package tolerance and assembly deviations.

TIM between the package and the application heat sink can be isolated for example by a gap filler, a thermal sheet, an isolated glue, and/or an electrically conductive material (like silver glue, solder or sinter paste).

Package TIM in combination with application TIM can lead to an advantageous double isolation, which may be highly appropriate for certain applications or for fulfilling one or more predefined standards (for example basic isolation, functional isolation, reinforced isolation).

Exemplary applications of exemplary embodiments relate to electromobility, electronic charging, engine control, etc.

FIG. 1 illustrates a cross-sectional view of a package 100 according to an exemplary embodiment.

The illustrated package 100 has a first main face 184 for mounting a heat sink 104 (not shown in FIG. 1, compare FIG. 3). Furthermore, the package 100 has an opposing second main face 186 for being mounted on a mounting base 102 (not shown in FIG. 1, compare FIG. 3). The package 100 comprises a carrier 106 and an electronic component 108 mounted at the carrier 106. Moreover, package 100 comprises an encapsulant 114 encapsulating the electronic component 108 and the carrier 106. The package 100 further comprises electrically insulating material 180 which covers electrically conductive material 182 of the carrier 106 at said first main face 184. Furthermore, the encapsulant 114 comprises a step 130 at said first main face 184.

FIG. 2 illustrates a flowchart 200 of a method of manufacturing a package 100 according to an exemplary embodiment. The reference signs used for the following description of said manufacturing method relate to the embodiment of FIG. 1.

Flowchart 200 relates to a method of manufacturing a package 100 having a first main face 184 for mounting a heat sink 104 and an opposing second main face 186 for being mounted on a mounting base 102.

As illustrated by block 202, the method of manufacturing package 100 comprises mounting an electronic component 108 at a carrier 106.

As illustrated by block 204, the method further comprises encapsulating at least part of the electronic component 108 and at least part of the carrier 106 by an encapsulant 114.

As illustrated by block 206, the method further comprises covering electrically conductive material 182 of the carrier 106 with electrically insulating material 180 at said first main face 184.

As illustrated by block 208, the method further comprises forming a step 130 at the encapsulant 114 at said first main face 184.

For example, the processes according to blocks 204 and 206 can be optionally carried out as a common simultaneous process, for instance by transfer molding. It is even possible that the processes according to blocks 204, 206 and 208 can be carried out optionally as a common simultaneous process, for instance by transfer molding.

FIG. 3 illustrates a schematic cross-sectional view of an electronic device 120 comprising a package 100 according to an exemplary embodiment and being mounted between a mounting base 102 at a bottom side and a heat sink 104 on a top side. More specifically, the heat sink 104 is mounted on the first face 184 of the package 100. Furthermore, the package 100 is mounted at its second main face 186 on mounting base 102. The electronic device 120 is manufactured in SMD technology.

For example, heat sink 104 may be a thermally conductive body made of a highly thermally conductive material such as copper or aluminum. For instance, the heat sink 104 may comprise a metallic plate 160 facing the package 100 and a plurality of mutually spaced cooling fins 162 integrally formed with the metallic plate 160 and facing away from the package 100. As shown, the heat sink 104 may be mounted on or may be attached to the package 100 so as to be thermally coupled with an exposed carrier 106 of the package 100.

Although not shown in FIG. 3, a thermal interface material (TIM), for example a gap filler, a thermal grease, a conductive glue, and/or a solder paste, can be used to connect the package 100 thermally to the application heat sink 104.

In the shown embodiment, the mounting base 102 is embodied as a printed circuit board (PCB). The package 100 is mounted, for instance by soldering, on the mounting base 102 so that electrically conductive pads 164 of the mounting base 102 are electrically coupled with free ends of electrically conductive leads 110 extending beyond a mold-type encapsulant 114 of the package 100. Solder structures between the pads 164 and the leads 110 are shown in FIG. 3 with reference signs 166.

The electrically conductive leads 110 (for instance made of copper or aluminum) of the package 100 are electrically coupled with pads 170 of an electronic component 108 of the package 100 by electrically conductive connection elements 168. In the shown embodiment, the electrically conductive connection elements 168 are bond wires, but may be alternatively bond ribbons or clips in other embodiments. As shown, the end portions of the leads 110 soldered on the pads 164 of the mounting base 102 may be bent away from the carrier 106. By taking this measure, the electric coupling side at the lower second main face 186 of the package 100 is spatially separated from the cooling side at the upper first main face 184 of the package 100.

As shown, an exterior surface of the carrier 106 being thermally coupled with the heat sink 104 is located on an upper side of the package 100 according to FIG. 3. Contact areas of the leads 110 being electrically coupled with the mounting base 102 are arranged at a lower side of the package 100.

A mounting height of multiple packages 100 and the tolerances of the application heat sink 104 may make the implementation of a height compensation layer with good thermal performance advantageous. For example, such a height compensation layer may be embodied as TIM between package 100 and heat sink 104, for example a gap filler, a thermal sheet (preferably soft), etc.

The already mentioned carrier 106 carries on its lower main surface the electronic component 108 and is thermally coupled at its upper main surface with the heat sink 104.

Electronic component 108 is mounted on the lower main surface (which may be denoted as a mounting surface) of the carrier 106. Said mounting surface may oppose another main surface of the carrier 106, which is oriented towards the heat sink 104. For instance, the electronic component 108 may be a semiconductor chip, for example a power semiconductor chip. Said semiconductor chip may comprises at least one integrated circuit element in a semiconductor body. Such at least one integrated circuit element may for example provide the function of a transistor (for instance of a MOSFET or an IGBT), a diode, etc.

As shown, the package 100 may further comprise encapsulant 114 encapsulating the electronic component 108, part of the leads 110, and part of the carrier 106. However, another part of the leads 110 is exposed with respect to the encapsulant 114 to be electrically coupled with the mounting base 102, as shown and described above. Furthermore, another part of the carrier 106 is exposed with respect to the encapsulant 114 so as to be thermally coupled with the heat sink 104. Preferably, encapsulant 114 is electrically insulating. For example, the encapsulant 114 may be a hard mold compound such as an epoxy-type mold compound (or alternatively a soft encapsulant such as silicone).

In the embodiment of FIG. 3, the carrier 106 comprises a thick sheet made of electrically insulating material 180 and comprises electrically conductive material 182 thereon, for instance a metal layer. The electrically insulating material 180 of the carrier 106 is exposed with respect to the encapsulant 114 at first face 184 of package 100. For example, the electrically insulating material 180 may be a ceramic plate. Moreover, the electrically insulating material 180 covers the electrically conductive material 182 of the carrier 106 at said first main face 184. The electronic component 108 is mounted on the electrically conductive material 182. As shown, the electrically conductive material 182 of the carrier 108 is electrically decoupled with respect to an exterior of the package 100. In the shown embodiment, the electrically insulating material 180 is formed as an exterior portion of the carrier 106.

Moreover, the encapsulant 114 comprises steps 130, 132 at said first main face 184 of the package 100. The heat sink 104 is mounted on the first main face 184 of the package 100 at which the steps 130, 132 are arranged. A part of the carrier 106, more precisely the electrically insulating material 180 thereof, is exposed with respect to the encapsulant 114 at the first main face 184 of the package 100 at which also the steps 130, 132 are arranged. As shown, each of the steps 130, 132 is formed by a vertical surface portion connecting two vertically spaced horizontal surface portions of the encapsulant 114 at said first main face 184. Furthermore, the carrier 106 is arranged laterally between the steps 130, 132. In the illustrated embodiment, the two steps 130, 132 are arranged symmetrically with respect to the carrier 106. More specifically, the steps 130, 132 are arranged symmetrically with respect to a mirror plane extending vertically and into the paper plane of FIG. 3. Descriptively speaking, the steps 130, 132 ensure a spatially extended and complex trajectory along which a creepage current must flow for unintentionally short-circuiting electrically conductive constituents of the package 100. This geometry strongly suppresses creepage current flow and ensures a reliable electric isolation of the package 100 at its first main face 184.

Hence, the embodiment of FIG. 3 provides a package 100 manufactured in surface mounted device (SMD) top side cooling (TSC) architecture. The structural features in form of the steps 130, 132 at an upper exterior side of the mold body constituting the encapsulant 114 increase the electric reliability of the package 100 and of the electronic device 120 as a whole. More specifically, the mold steps 130, 132 contribute to an increase of the creepage distance. Package 100 according to FIG. 3 thus meets high voltage requirements. As shown, the embodiment of FIG. 3 provides a package 100 in SMD TSC architecture with symmetrical leads 110 and a mainly centralized die pad. A substantially uniform planarity may be achieved after reflow soldering for fixing the package 100 on the mounting base 102.

FIG. 4 illustrates a three-dimensional top view of a package 100 according to an exemplary embodiment. FIG. 5 illustrates a three-dimensional bottom view of the package 100 according to FIG. 4. FIG. 6 illustrates a circuit diagram of the package 100 according to FIG. 4 and FIG. 5 and shows that the package 100 fulfills a transistor function (compare source S, drain D, gate G, and a further terminal K). FIG. 7 illustrates a three-dimensional bottom view of the package 100 according to FIG. 4 to FIG. 6 without encapsulant 114. FIG. 8 illustrates a side view of the package 100 according to FIG. 4 to FIG. 7 without encapsulant 114 and without electronic component 108.

In the embodiment of FIG. 4 to FIG. 8, the carrier 106 and the leads 110 form part of a common patterned and bent metal plate, for instance in a leadframe configuration. In other embodiments, it is possible that the carrier 106 is a Direct Copper Bonding (DCB) substrate, a Direct Aluminum Bonding (DAB) substrate, an Insulated Metal Substrate (IMS), or an Active Metal Brazing (AMB) substrate.

Furthermore, the leads 110 of the presently described embodiment comprise a first group 138 of leads 110 and a second group 140 of leads 110 extending side by side. As shown, each adjacent pair of the leads 110 of the first group 138 and each adjacent pair of the leads 110 of the second group 140 is spaced by a lateral lead-to-lead distance "d".

Said lead-to-lead distance "d" is smaller than (in particular not more than one third of) a lateral group-to-group distance "D" between the first group 138 and the second group 140 of leads 110. As shown, the first group 138 of leads 110 and the second group 140 of leads 110 extend out of the same side wall 144 of the encapsulant 114.

Moreover, the leads 110 further comprise a third group 146 of leads 110 and a fourth group 148 of leads 110 extending side by side. Each adjacent pair of the leads 110 of the third group 146 and each adjacent pair of the leads 110 of the fourth group 148 is spaced by said lateral lead-to-lead distance "d" being smaller than said lateral group-to-group distance "D" between the third group 146 and the fourth group 148 of leads 110. As shown as well, the third group 146 of leads 110 and the fourth group 148 of leads 110 extend out of another side wall 150 of the encapsulant 114 opposing the side wall 144 out of which the first group 138 of leads 110 and the second group 140 of leads 110 extend.

With the described configuration of the leads 110, different leads 110 of a respective group 138, 140, 146, 148 may be operated at very similar voltage values (for instance deviating from each other by a value in a range from 10 V to 50 V), so that relatively small lead-to-lead distances "d" are sufficient in terms of electric reliability. Furthermore, leads 110 of different groups 138, 140, 146, 148 may be separated by a significantly larger lateral group-to-group distance "D" to avoid undesired creepage currents and the like. The package 100 or the electronic device 120 may be designed so that a creepage distance between groups 138, 140, 146, 148 of leads 110 is approximately the same (for example should not differ by more than 20%) as a creepage distance between the package 100 and the heat sink 104.

Referring to FIG. 7, an electrically conductive connection element 168 is shown which is embodied as clip.

Referring to FIG. 8, a thickness "B" of the die paddle or carrier 106 may for instance be 2 mm or more for ensuring a proper heat removal from the electronic component 108 mounted thereon during operation of the package 100. For this purpose, the thickness "B" may be larger than the thickness "b" of leads 110. An exposed surface of the carrier 106 (compare FIG. 4) may be in a range from 50 mm 2 to 100 mm², for instance 87 mm². For example, the package body may have dimensions of approximately 15×21×4.8 mm³. The creepage characteristic and the clearance characteristic of the package 100 according to FIG. 4 to FIG. 8 (when covered with electrically insulating material 180) may fulfill requirements of operation voltages of 1200 V or more. Furthermore, the thermal performance of such a package 100 may be excellent in view of the efficient top side cooling. For example, an exposed surface of a carrier 106 can be in a range from 25 mm² (in a split die pad embodiment) up to 500 mm².

FIG. 9 illustrates a cross-sectional view of an electronic device 120 comprising a package 100 according to an exemplary embodiment with a heat sink 104 mounted thereon.

A difference between the embodiment of FIG. 9 and the embodiment of FIG. 3 is that, according to the embodiment of FIG. 9, the package 100 comprises an electrically insulating and thermally conductive interface layer 154 (for instance made of a thermal interface material, TIM) between the heat sink 104 and the carrier 106 of the package 100. The electrically insulating and thermally conductive interface layer 154 may be applied on an exterior side of the carrier 106 and on surrounding material of the encapsulant 114 for instance by printing or dispensing or molding (for example compression molding or transfer molding). The electrically insulating and thermally conductive interface layer 154 constitutes the above-described electrically insulating material 180 in the embodiment of FIG. 9. The pronounced thermal conductivity of the electrically insulating layer 154 contributes to an efficient removal of heat out of the package 100. A further difference between the embodiment of FIG. 9 and the embodiment of FIG. 3 is that, according to FIG. 9, carrier 106 consists only of electrically conductive material such as copper and is here embodied on the basis of a leadframe. Other configurations of the carrier 106 according to FIG. 9 are possible as well.

Furthermore, FIG. 9 illustrates that the different steps 130, 132 are arranged asymmetrically with respect to the carrier 106 and with respect to the electrically insulating material 118. As shown, a lateral distance between step 130 and carrier 106 is larger than a lateral distance between step 132 and carrier 106. Correspondingly, a lateral distance between step 130 and the electrically insulating material 180 is larger than a lateral distance between step 132 and the electrically insulating material 180. The electrically insulating material 180 ensures that the application heat sink 104 is electrically isolated with respect to the chip carrier 106.

FIG. 9 shows for the example on the side wall of the encapsulant 114 on the left-hand side of FIG. 9 a trajectory of a creepage current flowing unintentionally from the leads 110 to the first main face 184 of the package 100. Such a creepage current may create an undesired short-circuiting between a lead 110 and the metallic heat sink 104 and/or the carrier 106. In particular, such a creepage current must flow along sections with the respective lengths "a", "e", "c", "f", etc. As can be taken from FIG. 9, the presence of the step 130 renders the creepage current trajectory more complex and longer and therefore increases the creepage distance.

Advantageously, a sum of a height "c" of the step 130 and a height "t" of the electrically insulating material 180 can be at least 0.25 mm (for meeting the requirements of pollution class 1 according to IEC 60664-1:2007 in the version 2007-04, see in particular chapter 6.2), in particular at least 1 mm (for meeting the requirements of pollution class 2 according to IEC 60664-1:2007), and preferably at least 1.5 mm (for meeting the requirements of pollution class 3 according to IEC 60664-1:2007). For meeting the requirements of pollution class 4, the mentioned sum of heights may be at least 2.5 mm. Hence, the mentioned dimensioning design rule may ensure an environmentally friendly design of the package 100 while simultaneously meeting high voltage requirements.

Descriptively speaking, the creepage distance corresponds to the sum a+e+c+t. Exemplary values are a=2.3 mm, e=1.4 mm, c=1.1 mm, t=0.4 mm, which would result in a creepage distance of about 5 mm. In contrast to this, the creepage distance in the absence of the step 130 would be smaller by about a value of "e". For the example of a mold compound according to material group II corresponding to a comparative tracking index (CTI) of at least 400 V and below 600 V, a creepage distance of 5 mm may correspond to an operating voltage of about 707 V (in comparison with a smaller creepage distance in the absence of step 130 would correspond to an operating voltage of about 514 V). For the example of another mold compound according to material group I corresponding to a comparative tracking index (CTI) of at least 600 V, an even higher operating voltage of for example at least 1000 V may be obtained.

The illustrated mold step design advantageously results in a longer creepage distance which allows, in turn, to meet higher operating voltage requirements. In a configuration in which the creepage distance is at least 5.6 mm, it is in particularly possible to fulfil the requirements of 1200 V power devices.

In different embodiments, the isolation of chip carrier 106 and application heat sink 104 can be done in different ways:
  isolation by a thermally conductive mold compound (see for example embodiment of FIG. 12)
  isolation by a thermally conductive liquid (which may for example involve two times encapsulation)
  isolation by a thermally conductive sheet material (see for example embodiment of FIG. 9), for example implementing a thermal interface material (TIM) or an isolated metal substrate (IMS)
  isolation by ceramic substrate (see for example embodiment of FIG. 3), for example implementing a DCB or AMB substrate (wherein also a bare ceramic can be used, with the result that the manufacturing effort may be significantly lower than with a DCB or an AMB)
  isolation by a thermally conductive liquid (for instance applied by dispensing), such as a gap filler.

FIG. 10 illustrates a side view of packages 100 according to exemplary embodiments without encapsulant 114 and without electronic component 108.

All three configurations according to FIG. 10 show that the leads 110 are bent away downwardly from the carrier 106, the latter having a thickness "B" being larger than a thickness "b" of the leads 110. The three shown configurations have different leadframe thickness "B" along different die-pad exposed areas corresponding to different values of a width "L" of the respective die pad. From top to bottom of the three configurations of FIG. 10, the value "L" decreases from top to bottom, whereas the value "B" is the same in the top view and in the bottom view and is larger in the middle. Furthermore, a characteristic vertical distance "S" is shown which is the same in the middle and in the bottom view and smaller in the top view. The characteristic vertical distance "S" may denote a vertical distance between a carrier facing surface of a horizontal lead portion 110 and a component carrying surface of the carrier 106.

The locally thickened leadframe portion constituting the carrier 106 according to the middle view of FIG. 10 ensures a high heat removal capability of the package 100, since such a carrier 106 may efficiently conduct heat away from the electronic component 108. Moreover, it may be desired to have a sufficiently large characteristic vertical distance "S" of the leads 110 for obtaining a sufficiently large clearance distance. However, a very large characteristic vertical distance "S" may result in a package 100 with large space consumption in vertical direction. Advantageously, a moderate value of down set "M" of the leads 110 with respect to the carrier 106 may be sufficient when the thickness "B" of the carrier 106 is increased (as in the middle of FIG. 10). Preferably, a ratio between a thickness "B" of the carrier 106 and the down set "M" may be at least 0.5, preferably at least 1.0.

Summarizing, in particular the configuration in the middle of FIG. 10 combines a high thermal performance with a high clearance distance without an excessive reduction of the exposed heat sink area.

FIG. 11 illustrates a three-dimensional bottom view, a side view without encapsulant 114, and a transparent bottom view of a package 100 according to an exemplary embodiment.

The embodiment of FIG. 11 implements a retractable pin 190 implemented during a molding process for forming encapsulant 114. Descriptively speaking, the retractable pin 190 presses the carrier 106 downward during molding and therefore functions for defining a fixing point for fixing the die paddle during encapsulation. The retractable pin 190 may clamp on the die pad during molding to mitigate mold flash risk due to die pad tilt. After completing encapsulation, the retractable pin 190 may be removed. This may allow to obtain a fully isolated SMD device. Furthermore, a fully isolated tie bar-less package 100 may be created using the retractable pin 190 during molding. Retractable pins 190 can operate on both opposing sides of a chip carrier 106 to ensure a defined isolation layer thickness, for example to encapsulate the complete chip carrier 106.

Figure 12:
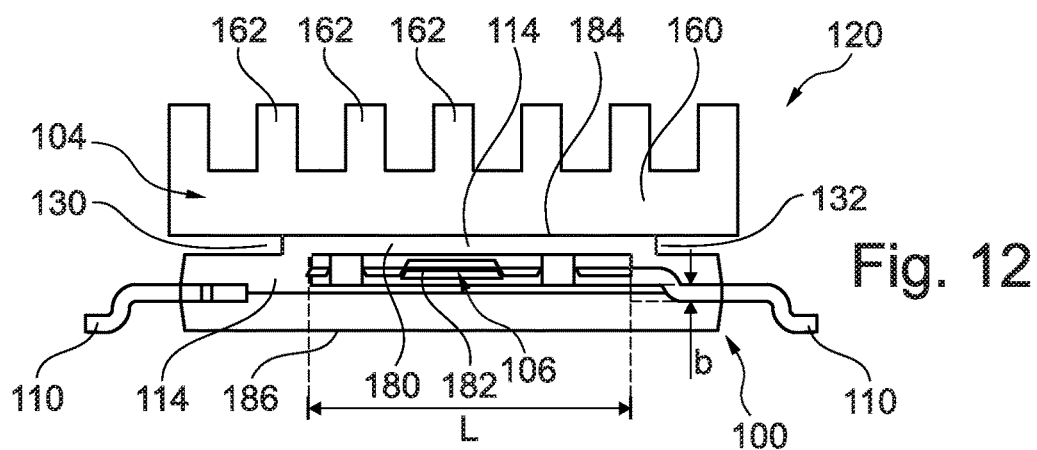
FIG. 12 illustrates a cross-sectional view of an electronic device comprising a package with an encapsulant having asymmetrical steps according to an exemplary embodiment with a heat sink mounted thereon.

FIG. 12 illustrates a cross-sectional view of an electronic device 120 comprising a package 100 with an encapsulant 114 having asymmetrical steps 130, 132 according to an exemplary embodiment with a heat sink 104 mounted thereon.

According to FIG. 12, the carrier 106 is entirely encapsulated by the encapsulant 114. In other words, the electrically insulating material 180 covering the metallic carrier 106 and spacing it with respect to the heat sink 104 consists of material of the encapsulant 114 according to the presently described embodiment. The embodiment of FIG. 12 corresponds to a leadframe configuration according to the top view of FIG. 10.

Figure 13:
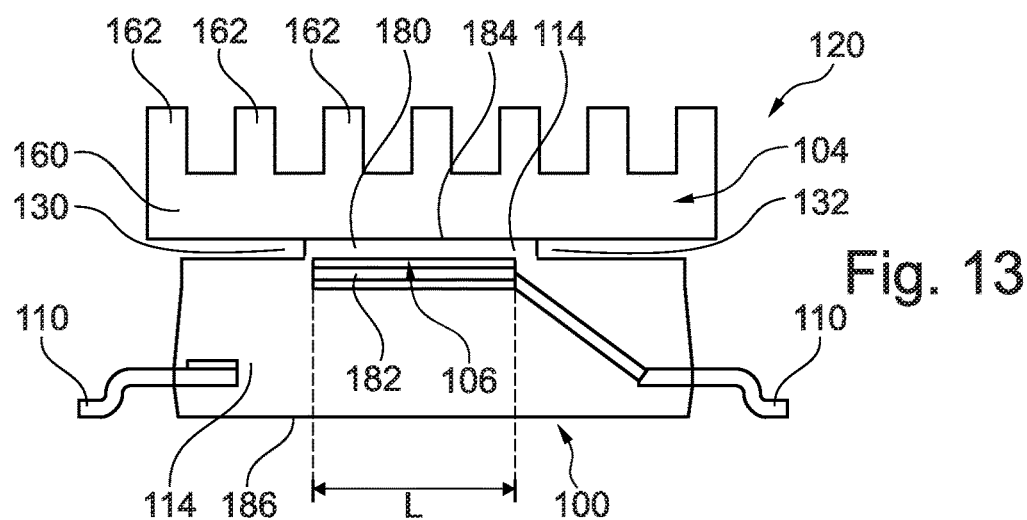
FIG. 13 illustrates a cross-sectional view of an electronic device comprising a package with an encapsulant having symmetrical steps according to an exemplary embodiment with a heat sink mounted thereon.

FIG. 13 illustrates a cross-sectional view of an electronic device 120 comprising a package 100 with an encapsulant 114 having symmetrical steps 130, 132 according to an exemplary embodiment with a heat sink 104 mounted thereon. A first difference between the embodiment of FIG. 13 and the embodiment of FIG. 12 is that, according to FIG. 13, the step configuration is symmetrical rather than asymmetrical. Furthermore, the embodiment of FIG. 13 corresponds to a leadframe configuration according to the bottom view of FIG. 10.

Figure 14:
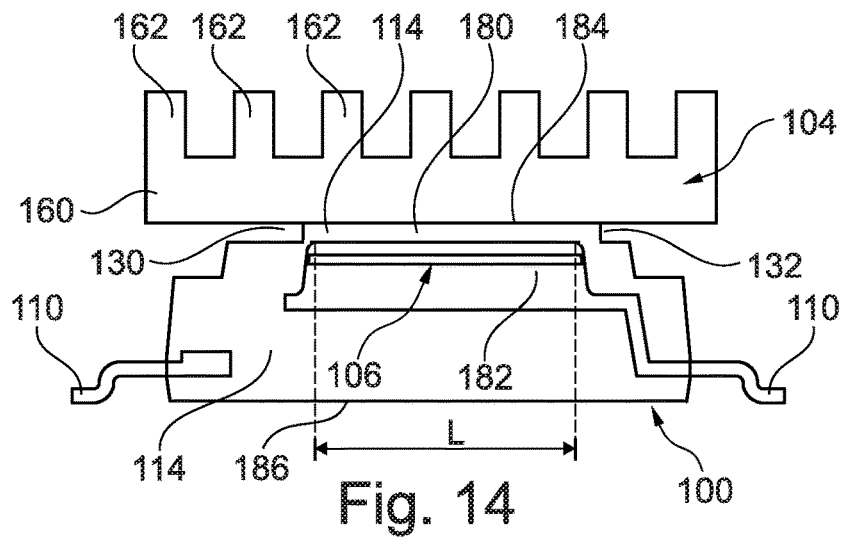
FIG. 14 illustrates a cross-sectional view of an electronic device comprising a package with an encapsulant having asymmetrical steps according to an exemplary embodiment with a heat sink mounted thereon.

FIG. 14 illustrates a cross-sectional view of an electronic device 120 comprising a package 100 with an encapsulant 114 having asymmetrical steps 130, 132 according to an exemplary embodiment with a heat sink 104 mounted thereon. A main difference between the embodiment of FIG. 14 and the embodiment of FIG. 12 is that the embodiment of FIG. 14 corresponds to a leadframe configuration according to the middle of FIG. 10.

The selection which of the embodiments of FIG. 12 to FIG. 14 is preferred for a specific application can be made by a tradeoff considering creepage behavior versus clearance behavior versus thermal performance versus manufacturability.

For instance, a die pad thickness of 2 mm instead of 0.9 mm or 1.27 mm may improve the exposed die-pad area and therefore the thermal performance and the capability of fitting in large chips (for example at a thickness of 2 mm up to a chip area of 75 mm$^2$, and at a thickness of 0.9 mm up to a chip area of 50 mm$^2$). This can be achieved by reducing the down set from 4.5 mm (at a die-pad thickness of 0.9 mm) to 2.9 mm (at a die-pad thickness of 2 mm).

A sufficiently large value of the down set may be advantageous to enable a sufficiently large clearance distance of preferably more than 3.2 mm, for example for meeting demanding requirements for SiC MOS high voltage devices (which may have a switching frequency higher than 30 kHz).

The addition of a mold step 130, 132 may increase the operating voltage, for instance from about 500 V to about 750 V. Such an increase may hence be around 250 V and therefore significant. This may enable to construct SiC MOS devices with operating voltage of up to 1200 V or even higher.

Figure 15:
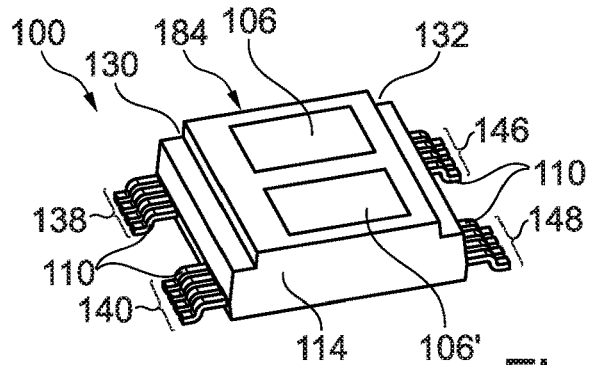
FIG. 15 illustrates a three-dimensional top view of a package with two exposed carriers and two electronic components according to an exemplary embodiment.
Figure 16:
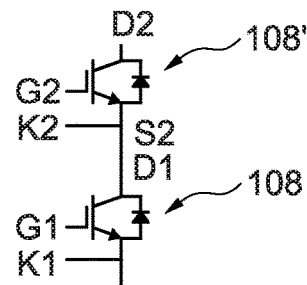
FIG. 16 illustrates a circuit diagram of the package according to FIG. 15.

FIG. 15 illustrates a three-dimensional top view of a package 100 with two exposed carriers 106, 106' and two electronic components 108, 108' according to an exemplary embodiment. FIG. 16 illustrates a circuit diagram of the package 100 according to FIG. 15 having a first field effect transistor (compare source S1, drain D1, gate G1, and a further terminal K1) and a second field effect transistor (compare source S2, drain D2, gate G2, and a further terminal K2) which are connected to form a half bridge.

Thus, in addition to the embodiment of FIG. 4, the embodiment according to FIG. 15 comprises a further carrier 106' and a further electronic component 108' mounted at the further carrier 106'. Furthermore, the electrically insulating material 180 (not shown in FIG. 15) may cover also electrically conductive material of the further carrier 106' at said first main face 184. Beyond this, the encapsulant 114 encapsulates also the further electronic component 108' and part of the further carrier 106'. The steps 130, 132 are formed at the first main face 184 of the package 100 also facing the further carrier 106'.

The embodiment of FIG. 15 is also compatible for operation at a voltage class of 1200 V and can be realized with a full isolation package design and split leads 110. The provision of an additional electronic component 108' allows for an extension of the functionality.

The package 100 according to FIG. 15 may also be embodied as an SMD TSC package with split die pad and 180° rotated gate/sense/source/drain pin layout. Advantageously, the embodiment of FIG. 15 may enable a shareable package outline dimension (POD) between single and split die pad. It may be possible to provide a split die pad for achieving a functional integration (in the shown embodiment as a half bridge).

Figure 17:
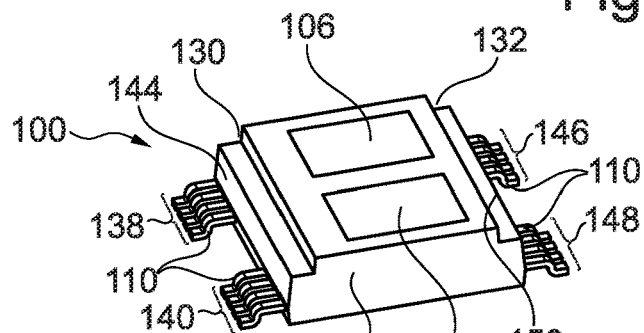
FIG. 17 illustrates a three-dimensional top view of a package with two exposed carriers and two electronic components according to another exemplary embodiment.
Figure 18:
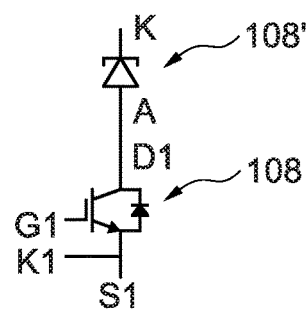
FIG. 18 illustrates a circuit diagram of the package according to FIG. 17.

FIG. 17 illustrates a three-dimensional top view of a package 100 with two exposed carriers 106, 106' and two electronic components 108, 108' according to another exemplary embodiment. FIG. 18 illustrates a circuit diagram of the package 100 according to FIG. 17 having a field effect transistor (compare source S1, drain D1, gate G1, and a further terminal K1) and a diode (compare anode A and cathode K) which are connected to form a boost circuitry.

Figure 19:
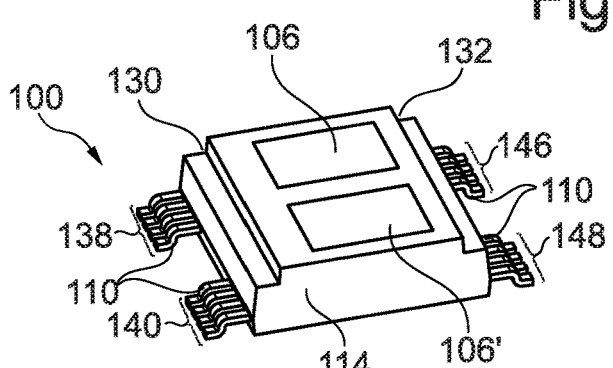
FIG. 19 illustrates a three-dimensional top view of a package with two exposed carriers and two electronic components according to still another exemplary embodiment.
Figure 20:
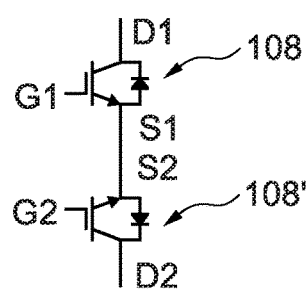
FIG. 20 illustrates a circuit diagram of the package according to FIG. 19.

FIG. 19 illustrates a three-dimensional top view of a package 100 with two exposed carriers 106, 106' and two electronic components 108, 108' according to still another exemplary embodiment. FIG. 20 illustrates a circuit diagram of the package 100 according to FIG. 19 having a first field effect transistor (compare source S1, drain D1, and gate G1) and a second field effect transistor (compare source S2, drain D2, and gate G2) which are connected to form an AC switch.

FIG. 21 illustrates a cross-sectional view of a package 100 with an encapsulant 114 having symmetrical steps 130, 132 according to an exemplary embodiment. FIG. 22 illustrates a side view of a package 100 with an encapsulant 114 having asymmetrical steps 130, 132 according to an exemplary embodiment. Both embodiments include mold steps 130, 132 to increase the creepage distance to meet high voltage requirements.

FIG. 23 illustrates a cross-sectional view of a package 100 with an encapsulant 114 having a bottom-sided recess 134 according to another exemplary embodiment. FIG. 24 illustrates a three-dimensional bottom view of the package 100 according to FIG. 23.

According to FIG. 23 and FIG. 24, the encapsulant 114 comprises a central recess 134 at the second main face 186 of the package 100 opposing the first main face 184 at which the steps 130, 132 are arranged. Said recess 134 forms two spacers 136 at said second main face 186 of the package 100. Hence, encapsulant 114 is here embodied as an SMD TSC structural mold body with the recess 134 at the bottom side. This configuration may reduce the risk of package tilting during PCB mounting (because particles of maximum size may be accommodated in the recess 134). This embodiment may be advantageously used in combination with negative lead standoff and may further reduce package height differences across multiple packages 100 sharing the same cooling heat sink 104 after reflow soldering.

A further advantageous feature of the embodiment of FIG. 23 and FIG. 24 is that each of two opposing side walls 144, 150 of the encapsulant 114 comprises an indentation 143 between different groups 138, 140, 146, 148 of leads 110. This may allow to obtain a package 100 in surface mounted device design and with top side cooling having an increased creepage distance between the different voltage domains of the various leads 110. For this purpose, a mold body intrusion in form of indentations 143 is arranged between the split leads 110. Such an indentation 143 may be arranged at one lead side or at the other lead side or at both lead sides (as shown). This may further increase the creepage current robustness to meet the requirements of even higher voltage classes.

Moreover, the leads 110 of the embodiment of FIG. 24 comprise array leads 152 which are ribbon-shaped rather than strip-shaped. Said ribbon-shaped leads 110 may also be denoted as fused leads and may advantageously enable a higher current capability, more heat dissipation, and higher second level reliability (like thermal cycling on board (TCoB)).

FIG. 25 illustrates a three-dimensional bottom view of a package 100 with an encapsulant 114 having a bottom-sided recess 134 according to another exemplary embodiment. The embodiment of FIG. 25 differs from the embodiment of FIG. 24 in particular in that, according to FIG. 25, the recess 134 delimits four (rather than two) spacers 136 in four corners of the bottom side of encapsulant 114.

FIG. 26 illustrates a three-dimensional view of a package 100 with an encapsulant 114 having a side wall 144 with indentation 143 according to another exemplary embodiment. The embodiment of FIG. 26 differs from the embodiment of FIG. 25 in that ribbon-shaped array leads 152 are foreseen side by side with individual strip-shaped leads 110 in each group 138, 140 of leads 110 according to FIG. 26.

Figure 27:
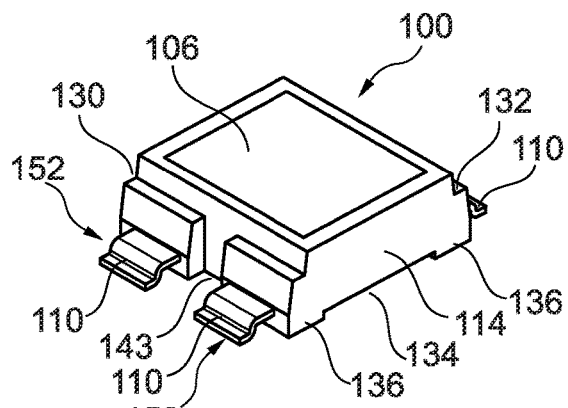
FIG. 27 illustrates a three-dimensional view of a package with an encapsulant having a side wall with indentation according to still another exemplary embodiment.

FIG. 27 illustrates a three-dimensional view of a package 100 with an encapsulant 114 having a side wall with indentation 143 according to still another exemplary embodiment. The embodiment of FIG. 27 differs from the embodiment of FIG. 26 in that only array leads 152 are foreseen according to FIG. 27.

Figure 28:
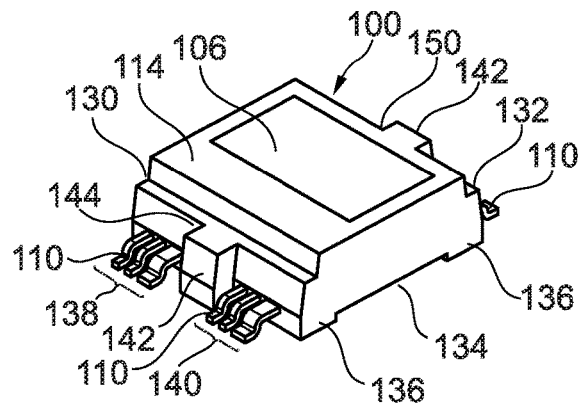
FIG. 28 illustrates a three-dimensional view of a package with an encapsulant having side walls with protrusions according to another exemplary embodiment.

FIG. 28 illustrates a three-dimensional view of a package 100 with an encapsulant 114 having side walls 144, 150 with protrusions 142 (rather than with indentations 143) according to another exemplary embodiment. Also with this configuration, the creepage distance between leads 110 may be increased, and the package 100 may be made compatible with even higher voltage requirements.

Figure 29:
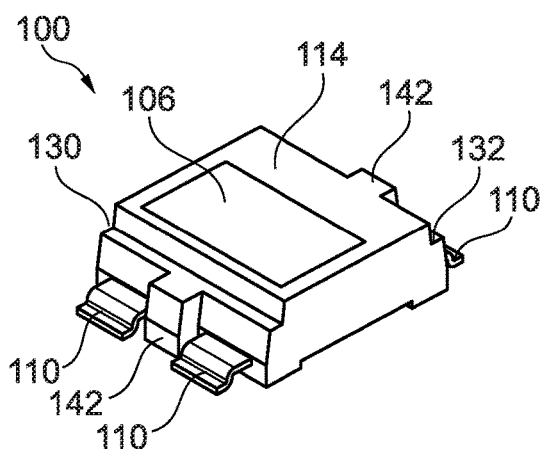
FIG. 29 illustrates a three-dimensional view of a package with an encapsulant having side walls with protrusions according to still another exemplary embodiment.

FIG. 29 illustrates a three-dimensional view of a package 100 with an encapsulant 114 having a side wall with protrusions 142 according to still another exemplary embodiment. The embodiment of FIG. 29 differs from the embodiment of FIG. 28 in that array leads 152 are foreseen (rather than individual leads 110) according to FIG. 29.

Figure 30:
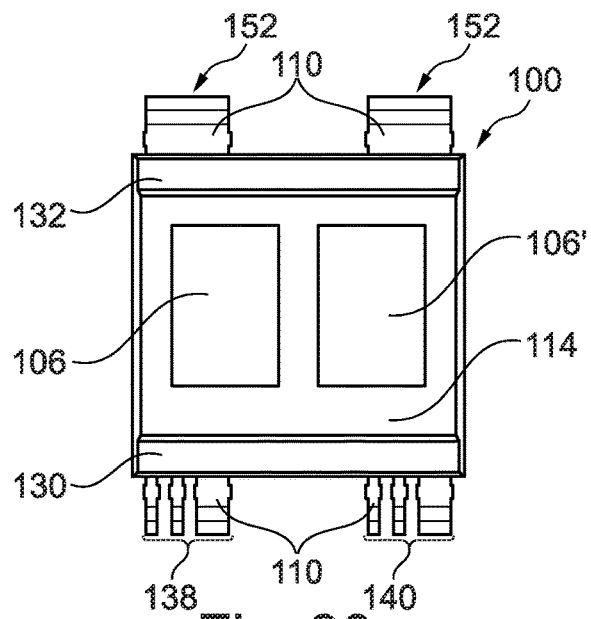
FIG. 30 illustrates a plan view of a package with two exposed carriers and two electronic components according to an exemplary embodiment.

FIG. 30 illustrates a plan view of a package 100 with two exposed carriers 106, 106' and two electronic components 108, 108' according to an exemplary embodiment. The embodiment of FIG. 30 is similar to the embodiments of FIG. 15, FIG. 17 and FIG. 19, but has array leads 152.

Hence, FIG. 30 shows an SMD TSC package 100 with array leads 152 and individual leads 110 arranged within a common package outline. The various leads 110 have different lead sizes, and there is no mirror lead configuration neither in a horizontal nor in a vertical axis.

Advantages of the embodiment of FIG. 30 are an efficient functional integration, a reduced lead count decrease mounting force, and an increased performance in view of fused leads. In view of the fused leads, a higher current carrying capability and reduced inductance may be achieved with the package 100 according to FIG. 30.

Figure 31:
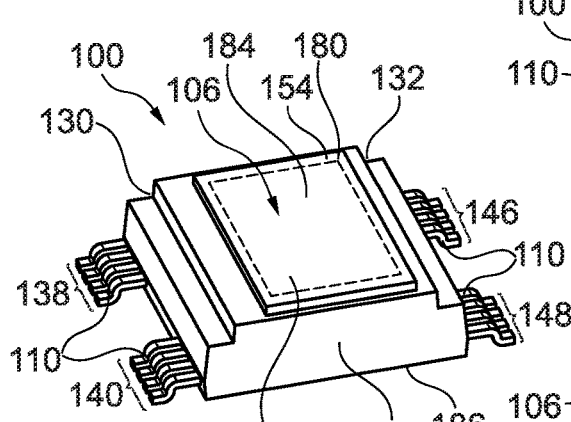
FIG. 31 illustrates a three-dimensional top view of a package with exposed carrier covered by a thermal interface material according to an exemplary embodiment.
Figure 32:
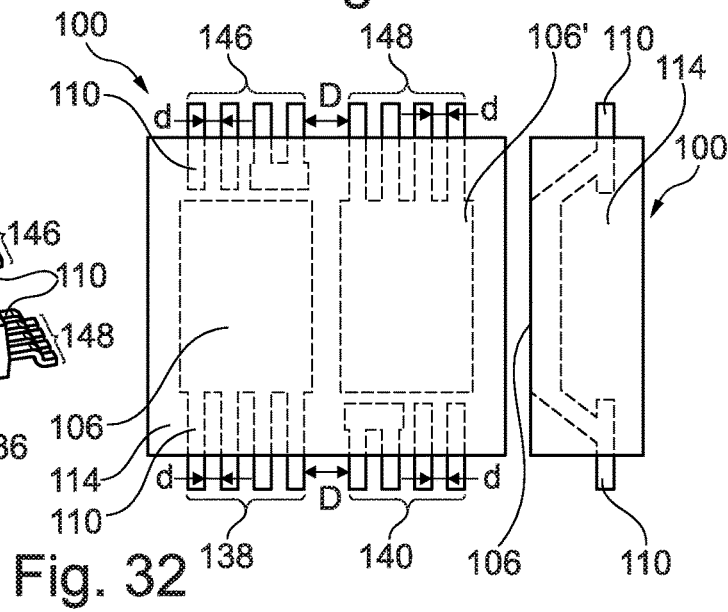
FIG. 32 illustrates a transparent top view and a transparent side view of the package according to FIG. 31.

FIG. 31 illustrates a three-dimensional top view of a package 100 with exposed carrier 106 covered by a thermal interface material according to an exemplary embodiment. FIG. 32 illustrates a transparent top view and a transparent side view of the package 100 according to FIG. 31. As can be best seen in FIG. 32, the carrier 106 and the further carrier 106' are embodied as identical structures rotated by 180° relative to each other within the paper plane of FIG. 32.

The package 100 according to FIG. 32 is manufactured in SMD TSC technology with full isolation. An electrically insulating and thermally conductive interface layer 154 covers the carriers 106, 106' embodied as single die pad. The embodiment of FIG. 31 and FIG. 32 is furthermore configured as tie bar-less package. An advantage of this illustrated full isolation package 100 is an SMD TSC architecture with split die pad and two leadframe sections which are down set (with 180° mutual rotation) inside a common package 100.

A further advantage of this embodiment is a shareable package outline dimension between single and split die pad. The architecture of FIG. 32 is appropriate for a functional integration and can for instance be used for creating a half bridge configuration or a boost configuration.

Figure 33:
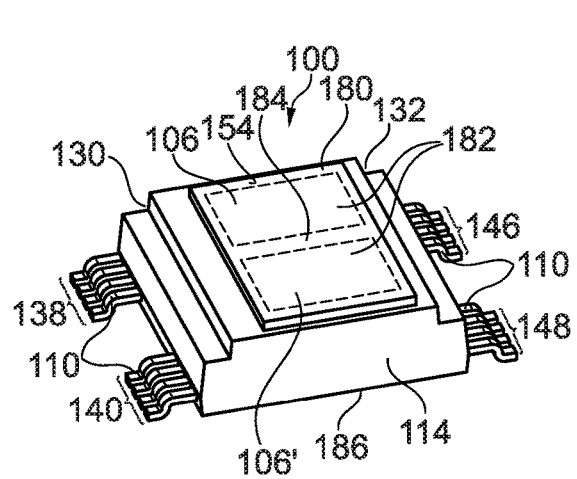
FIG. 33 illustrates a three-dimensional top view of a package with two exposed carriers covered by a thermal interface material according to another exemplary embodiment.
Figure 34:
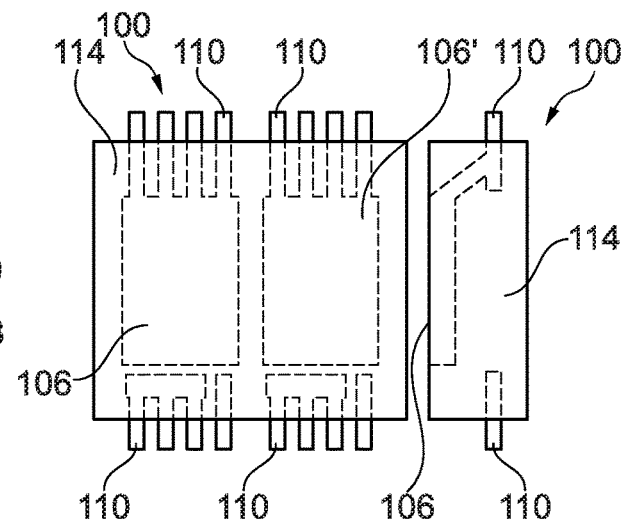
FIG. 34 illustrates a transparent top view and a transparent side view of the package according to FIG. 33.

FIG. 33 illustrates a three-dimensional top view of a package 100 with two exposed carriers 106 covered by a thermal interface material according to another exemplary embodiment. FIG. 34 illustrates a transparent top view and a transparent side view of the package 100 according to FIG. 33. Contrary to the embodiment of FIG. 31 and FIG. 32, the embodiment of FIG. 33 and FIG. 34 configures the carrier 106 and the further carrier 106' as identical structures aligned in parallel to each other. Thus, the package of FIG. 33 and FIG. 34 is manufactured in SMD TSC technology with split die pad and two down set leadframe sections (with the same row being down set) inside package 100.

An advantage is a shareable package outline dimension between single and split die pad. The split die pad configuration serves for a functional integration (for instance as AC switch).

Advantageously, a package 100 in SMD TSC technology is provided with full isolation between split die pad and application heat sink 104. Electrically insulating material covers the split die pad underneath. Furthermore, the embodiment of FIG. 33 and FIG. 34 is a tie bar-less package 100.

Figure 35:
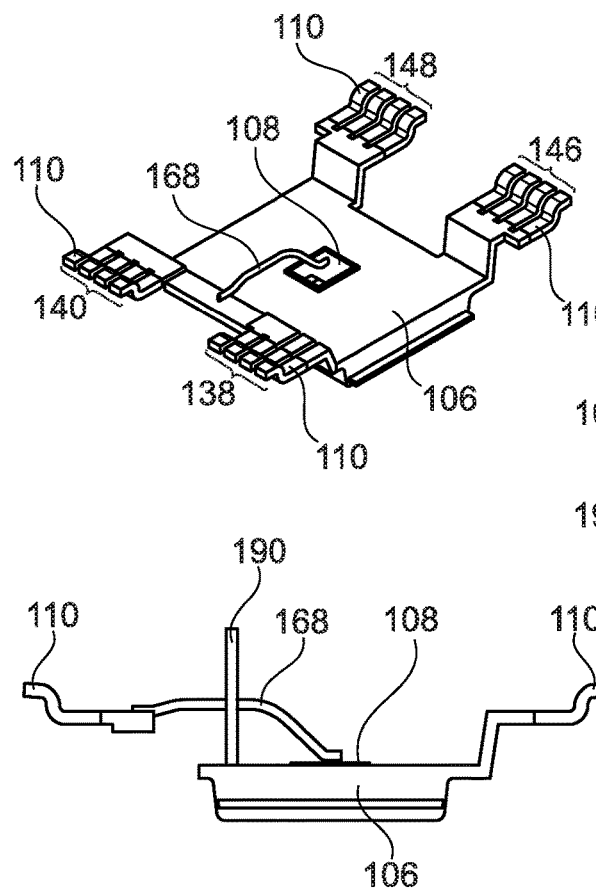
FIG. 35 illustrates a three-dimensional bottom view without encapsulant, a side view without encapsulant, and a transparent bottom view of a package according to still another exemplary embodiment.

FIG. 35 illustrates a three-dimensional bottom view without encapsulant 114, a side view without encapsulant 114, and a transparent bottom view of a package 100 according to still another exemplary embodiment. The embodiment of FIG. 35 differs from the embodiment of FIG. 11 in particular in that, according to FIG. 35, an electric coupling between leads 110 and the electronic component 108 is accomplished by a single bond wire-type electrically conductive connection element 168. Hence, the package 100 according to FIG. 35 has a particular simple and compact design.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package having a first main face for mounting a heat sink and an opposing second main face for being mounted on a mounting base, wherein the package comprises:
    a carrier having a carrier thickness;
    an electronic component mounted at the carrier;
    an encapsulant encapsulating at least part of the electronic component and at least part of the carrier;
    electrically insulating material covering electrically conductive material of the carrier at the first main face;
    wherein the encapsulant comprises at least one step at the first main face; and
    leads which are electrically coupled with the electronic component, the leads having a down set where a ratio of the carrier thickness and the down set is at least 0.5.

2. The package according to claim 1, where the ratio of the carrier thickness and the down set is at least 1.0.

3. The package according to claim 1, the carrier having a carrier first horizontal surface, where the electronic component is coupled to the carrier at the carrier first horizontal surface.

4. The package according to claim 3, the leads comprising a lead horizontal portion and a lead down set, where the lead down set is defined by a distance between the lead horizontal portion and the carrier first horizontal surface, and where the lead down set is greater than 0.5.

5. The package of claim 4, where the lead down set is greater than 1.0.

6. The package according to claim 4, where the leads are coupled to the carrier at the carrier first horizontal surface.

7. The package according to claim 1, comprising an electrically conductive material positioned between the electronic component and the carrier.

8. The package according to claim 1, wherein each of the at least one step is formed by a slanted or vertical surface portion connecting two vertically spaced slanted or horizontal surface portions of the encapsulant at the first main face.

9. The package according to claim 1, comprising a plurality of steps at the first main face, wherein the carrier is arranged laterally between different ones of the steps.

10. The package according to claim 9,
    wherein said different steps are arranged symmetrically with respect to the carrier and/or with respect to the electrically insulating material.

11. The package according to claim 1, wherein the leads are bent away downwardly from the carrier, the carrier thickness being larger than a thickness of the leads.

12. The package according to claim 1, wherein a part of the leads is encapsulated by the encapsulant and another part of the leads is exposed with respect to the encapsulant.

13. The package according to claim 1, wherein a side wall of the encapsulant comprises a protrusion or an indentation between different groups of leads.

14. An electronic device, comprising:
a package according to claim 1; and
the heat sink mounted on a first main face of the package.

15. The electronic device according to claim 14, comprising a mounting base on which the package is mounted.

16. A package having a first main face for mounting a heat sink and an opposing second main face for being mounted on a mounting base, wherein the package comprises:
 a carrier having a carrier thickness, where the carrier comprises a patterned metal plate;
 an electronic component mounted at the carrier;
 an encapsulant encapsulating at least part of the electronic component and at least part of the carrier;
 electrically insulating material covering electrically conductive material of the carrier at the first main face, the electrically insulating material comprising a ceramic substrate;
 wherein the encapsulant comprises at least one step at the first main face; and
 leads which are electrically coupled with the electronic component, the leads having a down set where a ratio of the carrier thickness and the down set is at least 0.5.

17. The package according to claim 16, where the ratio of the carrier thickness and the down set is at least 1.0.

18. The package according to claim 16, wherein the leads comprise a first group of leads and a second group of leads extending side by side, wherein each adjacent pair of the leads of the first group and each adjacent pair of the leads of the second group is spaced by a lateral lead-to-lead distance being smaller than a lateral group-to-group distance between the first group and the second group of leads.

19. The package according to claim 18, wherein the first group of leads and the second group of leads extend out of the same side wall of the encapsulant.

20. The package according to claim 16, wherein the leads are bent away downwardly from the carrier, the carrier having a thickness being larger than a thickness of the leads.

* * * * *